HIGH SPEED BISTABLE SWITCHING CIRCUITS WHICH UTILIZE ADDITIONAL TRIGGER STAGES FOR PROVIDING UNDELAYED OUTPUT
Filed July 15, 1963
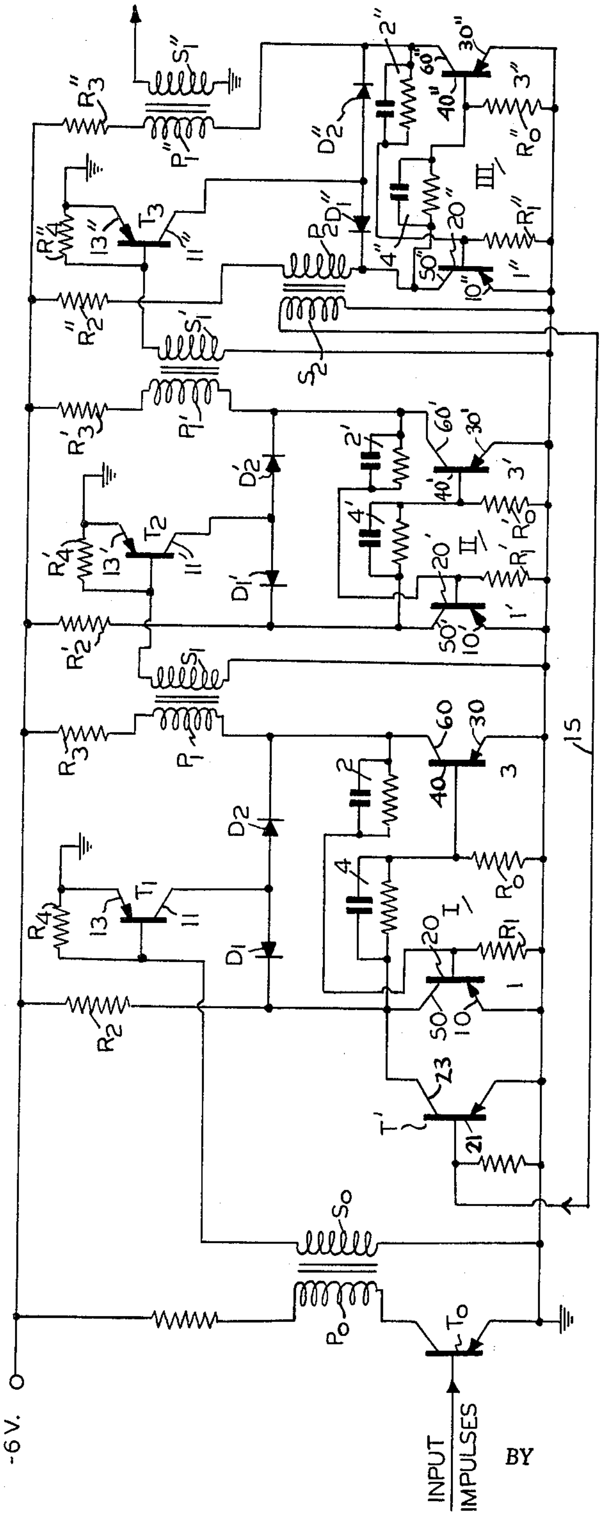
INVENTOR
WILLIAM ARTHUR WARD
BY Rines and Rines
ATTORNEYS United States Patent Office 3,246,167

Patented Apr. 12, 1966

3,246,167

HIGH SPEED BISTABLE SWITCHING CIRCUITS WHICH UTILIZE ADDITIONAL TRIGGER STAGES FOR PROVIDING UNDELAYED OUTPUT

William Arthur Ward, Norwood, Mass., assignor to United States Scientific Instruments, Inc., Watertown, Mass., a corporation of Massachusetts Filed July 15, 1963, Ser. No. 294,818
14 Claims. (Cl. 307—88.5)

The present invention relates to high-speed bistable switching circuits and, more particularly, to high-speed flip-flop circuits adapted for utilization in counting chains and the like.

While the art currently employs transistors and related solid-state relays as flip-flop circuits in electronic counters and the like, the present invention is adapted for utilization, also, in connection with electron tubes or other relays; though, for purposes of illustration, the invention is hereinafter described in connection with the use of transistors. In such transistor flip-flop circuits, an output pulse is produced by the turning off of one of the transistors of the pair of flip-flop transistor relays. There is, however, an inherent switching-off storage time involved in the effective reaching of common collector-emitter potential in transistors that may be of the order of, for example, 40 nanoseconds in the case of high-speed transistors, such as the type 2N769 (Sprague Electric Company) or 2N976 (Philco). The operational speed of flip-flop circuits of this character is thus limited because of the reliance, somewhere in the chain of flip flops, upon the normal shutting-off time of a flip-flop stage.

In accordance with the present invention, on the other hand, one or more additional trigger transistor stages are employed with the flip-flop circuits and are triggered simultaneously with the onset of the switching of the first flip-flop stage to provide enough supplemental trigger signal to complement the flip-flop, thus eliminating the normal switching-off storage time thereof. In addition, while the transistors of flip-flop circuits are driven into saturation to produce an output pulse, it is not required that the additional trigger transistors of the invention be so driven into saturation, thus again not limiting the speed characteristics of the stages.

An object of the invention, therefore, is to provide a new and improved relay switching circuit that shall not be subject to the above-described speed-limiting disadvantages, but shall be enabled to provide very high-speed switching without limitations of switching-off time or saturation operation.

Another object is to provide a novel transistor switching circuit of more general utility, also.

Other and further objects will be explained hereinafter and will be more fully described in connection with the appended claims.

The invention will now be explained with reference to the circuit diagram shown in the single figure of the accompanying drawing, illustrating a preferred embodiment of the invention.

Referring to the drawing, a chain of three successive flip-flop circuits is shown at I, II and III, each provided with left-hand and right-hand transistor relay devices, respectively numbered 1–1, 1′–3′, and 1″–3″, each provided with corresponding grounded emitters 10–30, 10′–30′, 10″–30″; respective base electrodes 20–40, 20′–40′, 20″–40″; and respective collector electrodes 50–60, 50′–60′, and 50″–60″. The base electrodes 20, 20′ and 20″ of the left-hand relay devices 1, 1′, 1″ are shown returned to ground through respective resistors $R_1$, $R_1'$ and $R_1''$, and connected through R-C coupling circuits 2, 2′ and 2″ to the respective collector electrodes 60, 60′ and

60″ of the right-hand relay stages 3, 3′ and 3″. The base electrodes 40, 40′ and 40″ of the right-hand stages 3, 3′ and 3″, respectively, are, in turn, connected to ground through respective return resistors $R_0$, $R_0'$ and $R_0''$, and are coupled by respective R-C circuits 4, 4′ and 4″ back to the collector electrodes 50, 50′ and 50″ of the left-hand relay stages 1, 1′ and 1″. The −6 volt supply terminal is connected through resistors $R_2$, $R_2'$ and $R_2''$ to the respective collectors 50, 50′ and 50″.

Between the collector electrodes 50 and 60 of the left- and right-hand relays 1 and 3 of the flip-flop stage I, between collector electrodes 50′ and 60′ of the transistors 1′ and 3′ of the second stage II, and between collector electrodes 50″ and 60″ of the relays 1″ and 3″ of the third stage III, are connected respective pairs of series-connected oppositely poled steering diodes $D_1$–$D_2$, $D_1$–$D_2'$ and $D_1''$–$D_2''$. The coupling between stages I, II and III is shown effected by, for example, polarity-inversion transformers having respective primary windings $P_1$, $P_1'$ and $P_1''$ cooperating with corresponding secondary windings $S_1$, $S_1'$ and $S_1''$. The primary windings $P_1$, $P_1'$ and $P_1''$ are connected through resistors $R_3$, $R_3'$, and $R_3''$ to the −6 volt terminal, and are connected, also, to respective collector electrodes 60, 60′ and 60″ of the transistors 3, 3′ and 3″.

In the input of the first stage I, an input transformer $P_0$–$S_0$ is provided, inverting the input impulses fed through an input transistor $T_0$.

Each of the secondary windings $S_0$, $S_1$, $S_1'$ and $S_1''$ is shown grounded at its lower terminal, and the windings $S_0$, $S_1$ and $S_1'$ are further connected at their respective upper terminals to the bases of respective additional trigger transistors $T_1$, $T_2$ and $T_3$, employed in accordance with the invention. The collector electrodes 11, 11′ and 11″ of the trigger transistors $T_1$, $T_2$ and $T_3$ are connected to the points of junction of respective pairs of steering diodes $D_1$–$D_2$, $D_1'$–$D_2'$ and $D_1''$–$D_2''$, while the emitter electrodes 13, 13′ and 13″ are shown grounded and also connected through respective resistors $R_4$, $R_4'$ and $R_4''$ back to the base electrodes of the respective trigger transistors $T_1$, $T_2$ and $T_3$.

The first trigger transistor $T_1$ thus receives an input pulse through the secondary winding $S_0$ as a result of the application of an input pulse to the input transistor $T_0$. If it be assumed, for example, that the right-hand transistors 3, 3′ and 3″ of the stages I, II and III are all initially conducting, a negative input pulse applied to the base of the input transistor $T_0$ will produce, through the inversion of the transformer $P_0$–$S_0$, a negative pulse at the base of the normally non-conducting trigger transistor $T_1$. This negative pulse results in the application of a positive pulse to the collector 50 of the transistor 1 of stage I, feeding a positive pulse through the R-C coupling network 4 to the base 40 of the right-hand transistor 3 and thus shutting the transistor 3 off by this supplemental trigger signal from $T_1$, and independent of the normal shutting-off storage time of transistor 3, if left to normal flip-flop complementing action. It will be clear that adequate trigger signal from $T_1$ can be obtained so to control the complementing of flip-flop I without the necessity of driving the stage $T_1$ into saturation. The collector 60 of the transistor 3 will then rise to the −6 volt level. Only a very small positive signal will thus be produced that is coupled through the transformer $P_1$–$S_1$ to the base of the trigger transistor stage $T_2$, producing no effect upon that operation of that stage.

The next input pulse applied to the input transistor $T_0$, however, will cause the collector 60 of the transistor 3 to go positive, resulting in the production in the secondary winding $S_1$ of a negative pulse (because of the polarity inversion in the transformer $P_1$–$S_1$) which does appreciably affect the base of the trigger stage $T_2$ and, in turn, produces a signal that causes the collector 50' of the transistor 1' to go positive, thus cutting off the transistor 3' of the second flip-flop stage II—again without the time delay of the normal shutting-off storage time of transistor 3' and without the necessity of operating $T_2$ in saturation. Similarly, the third input impulse at $T_0$ will cause the same result that occurred in connection with the first pulse applied to the stage I. The fourth input pulse applied by $T_0$, however, produces in the secondary winding $S_1'$ the same result that the second pulse produced in the secondary winding $S_1$, driving the base of the trigger stage $T_3$ negative and thus causing the right-hand transistor 3'' of the stage III to cut off, and the transistor 1'' to conduct.

When the fourth pulse has driven the stage III to this condition, however, a feedback pulse will be fed from the collector 50'' of the transistor 1'' through a further transformer $P_2$–$S_2$, via conductor 15, to the base 21 of a further grounded emitter stage T', the collector 23 of which is connected to the collector 50 of the transistor 1 of the first bistable flip-flop stage I. This feedback impulse that is thus applied to the first stage I may produce a factor of seven division, as is well known.

In each instance, the actual output pulse from each of the stages I, II and III, instead of being produced by the normal flip-flop shutting-off action, is produced by the supplemental signal from the trigger transistors, obviating the normal switching-off storage time delay of the flip-flop transistors, so that a rapid passage of the trigger impulses occurs down the chain, not subject to the speed limitations of conventional flip-flop circuits of this character. The transformers in the outputs, of course, or other polarity-inverting devices that may be used therefor, produce the right polarity of signal and themselves introduce only negligible delays into the system.

Further modifications will occur to those skilled in the art and all such are considered to fall within the spirit and scope of the invention as defined in the appended claims.

What is claimed is:

1. High-speed bistable switching apparatus having, in combination, a plurality of successively coupled flip-flop circuits the input of each of which contains coupling means comprising polarity-inverting means connected with a normally non-conductive trigger device, means for applying a first impulse to the input of the first of the plurality of flip-flop circuits in order to render the trigger device therein conductive to produce a trigger signal, the trigger signal being applied to the first flip-flop circuit to control the complementing of the same substantially independently of the inherent shutting-off time of the flip-flop, and means for applying further impulses to the input of the first flip-flop circuit to render conductive the trigger devices of the successive coupling means of the successively coupled flip-trigger device therein conductive to produce a trigger signals for complementing the corresponding flip-flop circuits, successively.

2. High-speed bistable switching apparatus as claimed in claim 1 and in which means is provided for feeding back signals to the first flip-flop circuit from another of the plurality of flip-flop circuits.

3. High-speed bistable switching apparatus as claimed in claim 1 and in which the polarity-inverting means comprises transformer means.

4. High-speed bistable switching apparatus having, in combination, a plurality of successively coupled transistor flip-flop circuits the input of each of which contains coupling means comprising polarity-inverting means connected with a normally non-conductive trigger device, means for applying a first impulse to the input of the first of the plurality of flip-flop circuits in order to render the trigger device therein conductive to produce a trigger signal, the trigger signal being applied to the first flip-flop circuit to control the complementing of the same substantially independently of the inherent flip-flop transistor shutting-off time, and means for applying further impulses to the input of the first flip-flop circuit to render conductive the trigger devices of the successive coupling means of the successively coupled flip-flop circuits in order to produce successive further trigger signals for complementing the corresponding flip-flop circuits, successively.

5. High-speed bistable switching apparatus having, in combination, a plurality of successively coupled transistor flip-flop circuits the input of each of which contains coupling means comprising polarity-inverting means connected with a normally non-conductive transistor trigger device, means for applying a first impulse to the input of the first of the plurality of flip-flop circuits in order to render device therein conductive to produce a trigger signal, the trigger signal being applied to the first flip-flop circuit to control the complementing of the same substantially independently of the inherent flip-flop transistor shutting-off time, and means for applying further impulses to the input of the first flip-flop circuit to render conductive the trigger devices of the successive coupling means of the successively coupled flip-flop circuits in order to produce successive further trigger signals for complementing the corresponding flip-flop circuits, successively.

6. High-speed bistable switching apparatus having, in combination, a plurality of successively coupled transistor flip-flop circuits the input of each of which contains coupling means comprising polarity-inverting transformer means connected with a normally non-conductive transistor trigger device, means for applying a first impulse to the input of the first of the plurality of flip-flop circuits in order to render the trigger device therein conductive to produce a trigger signal, the trigger signal being applied to the first flip-flop circuit to control the complementing of the same substantially independently of the inherent flip-flop transistor shutting-off time, and means for applying further impulses to the input of the first flip-flop circuit to render conductive the trigger devices of the successive coupling means of the successively coupled flip-flop circuits in order to produce successive further trigger signals for complementing the corresponding flip-flop circuits, successively.

7. High-speed bistable switching apparatus having, in combination, a plurality of successively coupled flip-flop circuits each comprising a pair of transistors and each having an input and an output with the output connected to the input of the next successive flip-flop circuit by coupling means comprising polarity-inverting means connected with a normally non-conductive transistor trigger device, a pair of steering diodes connected with each of said pair of transistors, means for connecting each trigger device to the corresponding pair of steering diodes, means for applying a first impulse to the input of the first of the plurality of flip-flop circuits in order to render the trigger device therein conductive to produce a trigger signal, the trigger signal being applied to the first flip-flop circuit to control the complementing of the same substantially independently of the inherent flip-flop transistor shutting-off time, and means for applying further impulses to the input of the first flip-flop circuit to render conductive the trigger devices of the successive coupling means of the successively coupled flip-flop circuits in order to produce successive further trigger signals for complementing the corresponding flip-flop circuits, successively.

8. High-speed bistable switching apparatus having, in combination, a plurality of successively coupled flip-flop circuits each comprising a pair of transistors and each having an input and an output with the output connected to the input of the next successive flip-flop circuit by coupling means comprising polarity-inverting transformer means connected with a normally non-conductive transistor trigger device, a pair of steering diodes connected with each of said pair of transistors, means for connecting each trigger device to the corresponding pair of steering diodes, means for applying a first impulse to the input of the first of the plurality of flip-flop circuits in order to render the trigger device therein conductive to produce a trigger signal, the trigger signal being applied to the first flip-flop circuit to control the complementing of the same substantially independently of the inherent flip-flop transistor shutting-off time, and means for applying further impulses to the input of the first flip-flop circuit to render conductive the trigger devices of the successive coupling means of the successively coupled flip-flop circuits in order to produce successive further trigger signals for complementing the corresponding flip-flop circuits, successively.

9. High-speed bistable switching apparatus having, in combination, a plurality of successively coupled flip-flop circuits each comprising a pair of transistors and each having an input and an output with the output connected to the input of the next successive flip-flop circuit by coupling means comprising polarity-inverting transformer means connected with a normally non-conductive grounded-emitter transistor trigger device, a pair of steering diodes connected with each of said pair of transistors, means for connecting each trigger device to the corresponding pair of steering diodes, means for applying a first impulse to the input of the first of the plurality of flip-flop circuits in order to render the trigger device therein conductive to produce a trigger signal, the trigger signal being applied to the first flip-flop circuit to control the complementing of the same substantially independently of the inherent flip-flop transistor shutting-off time, and means for applying further impulses to the input of the first flip-flop circuit to render conductive the trigger devices of the successive coupling means of the successively coupled flip-flop circuits in order to produce successive further trigger signals for complementing the corresponding flip-flop circuits, successively.

10. High-speed bistable switching apparatus as claimed in claim 9 and in which the collector of each trigger transistor is connected intermediate the diodes of the corresponding pair of steering diodes.

11. High-speed bistable switching apparatus as claimed in claim 9 and in which transformer-coupled feedback means is connected to the said first flip-flop circuit from a subsequent flip-flop circuit.

12. A transistor switching stage comprising a pair of transistor relays coupled to form a flip-flop circuit and having a corresponding pair of input circuits each containing a steering diode with the steering diodes having a common junction, a normally non-conducting trigger transistor having an input and an output, the output being connected at the said common junction of the diodes, transformer means having primary and secondary windings, the primary winding of which is connected to receive input pulses, and means for connecting the input of the trigger transistor to the secondary winding to receive impulses therefrom that render the trigger transistor conductive upon application of the input impulses to the primary winding.

13. A switching stage as claimed in claim 12 and in which the transformer means is a polarity inverter.

14. A switching stage as claimed in claim 12 and in which the trigger transistor is of the grounded emitter type, with its collector connected to the said junction of the diodes.

No references cited.

DAVID J. GALVIN, *Primary Examiner.*

ARTHUR GAUSS, *Examiner.*